United States Patent
San et al.

(10) Patent No.: US 6,767,836 B2
(45) Date of Patent: Jul. 27, 2004

(54) METHOD OF CLEANING A CVD REACTION CHAMBER USING AN ACTIVE OXYGEN SPECIES

(75) Inventors: Nelson Loke Chou San, Tokyo (JP); Kenichi Kagami, Tokyo (JP); Kiyoshi Satoh, Tokyo (JP)

(73) Assignee: ASM Japan K.K. (JP)

( * ) Notice: Subject to any disclaimer, the term of this patent is extended or adjusted under 35 U.S.C. 154(b) by 2 days.

(21) Appl. No.: 10/235,217

(22) Filed: Sep. 4, 2002

(65) Prior Publication Data

US 2004/0043626 A1 Mar. 4, 2004

(51) Int. Cl.$^7$ .................. H01L 21/302; H01L 21/461
(52) U.S. Cl. ................ 438/710; 438/706; 438/714; 438/905; 134/1.1; 156/345
(58) Field of Search ................. 438/710, 714, 438/727, 730, 758, 778, 905, 706, 707, 711; 134/26, 1.1; 156/345, 643

(56) References Cited

U.S. PATENT DOCUMENTS

| | | | | |
|---|---|---|---|---|
| 5,252,178 A | * | 10/1993 | Moslehi | ............ 134/1.1 |
| 5,281,302 A | * | 1/1994 | Gabric et al. | ............ 216/67 |
| 5,356,478 A | * | 10/1994 | Chen et al. | ............ 134/1 |
| 5,756,400 A | * | 5/1998 | Ye et al. | ............ 438/710 |
| 6,187,691 B1 | | 2/2001 | Fukuda et al. | |
| 6,271,148 B1 | | 8/2001 | Kao et al. | |
| 6,329,297 B1 | | 12/2001 | Balish et al. | |
| 6,347,636 B1 | | 2/2002 | Xia et al. | |
| 6,352,945 B1 | | 3/2002 | Matsuki et al. | |
| 6,374,831 B1 | | 4/2002 | Chandran et al. | |
| 6,383,955 B1 | | 5/2002 | Matsuki et al. | |
| 6,387,207 B1 | | 5/2002 | Janakiraman et al. | |
| 6,569,257 B1 | * | 5/2003 | Nguyen et al. | ............ 134/26 |
| 2002/0011210 A1 | | 1/2002 | Satoh et al. | |
| 2003/0015798 A1 | * | 1/2003 | Haruhana et al. | ............ 257/758 |

FOREIGN PATENT DOCUMENTS

| | | | |
|---|---|---|---|
| JP | 61-250185 | * | 7/1986 |
| JP | 403183125 A | * | 8/1991 |

* cited by examiner

*Primary Examiner*—Amir Zarabian
*Assistant Examiner*—Khanh Duong
(74) *Attorney, Agent, or Firm*—Knobbe, Martens, Olson & Bear, LLP

(57) ABSTRACT

Provided herein is a method for cleaning CVD reaction chambers with active oxygen species. The active oxygen species may also be mixed with active fluorine species. The active oxygen species are products of a plasma, which may be either generated within the CVD reaction chamber or generated remotely and introduced into the CVD reaction chamber.

40 Claims, 9 Drawing Sheets

METHOD OF CLEANING A CVD REACTION CHAMBER USING AN ACTIVE OXYGEN SPECIES

FIELD OF THE INVENTION

This disclosure relates generally to cleaning a chemical vapor deposition (CPU) and more particularly, to cleaning carbon-containing deposits from a CVD with active oxygen species.

BACKGROUND OF THE INVENTION

In a conventional large scale integration (LSI) device—for example, a CPU, memory, or system LSI—the insulator between the metal circuit lines is silicon dioxide ($SiH_4$ based $SiO_2$ or TEOS based $SiO_2$) or fluorinated silica glass. Reducing the resistance of the metal lines or the capacitance of the insulator between metal lines allows increased speed in a device. The resistance of the metal lines may be reduced by using copper as the conductor instead of an aluminum alloy. The capacitance of the insulator may be reduced by using a low-k film rather than $SiO_2$ or related materials. The dielectric constant of $SiO_2$-based films is typically from about 3.8 to about 4.4. The dielectric constant of a low-k film is typically from about 2.0 to about 3.0. Through these methods, RC delay may be reduced, thereby allowing the fabrication of faster devices.

Several low-k materials have been developed. One type of low-k material is carbon-doped $SiO_2$. Such a film typically contains Si, O, C, and H. See, for example, U.S. Pat. Nos. 6,352,945 and 6,383,955.

When pure or fluorine-doped $SiO_2$ is deposited on a semiconductor wafer in a chemical vapor deposition (CVD) reactor, some $SiO_2$ is also deposited on interior surfaces of the CVD reactor. This contaminating material is typically removed by in-situ plasma discharge. A fluorine-containing gas is used as a cleaning gas, which is activated by a local plasma discharge within the CVD chamber. Examples of such cleaning gases include $C_2F_6$, $CF_4$, and $C_3F_8$, mixed with $O_2$.

The fluorocarbons used in the cleaning process are "greenhouse gases," believe to contribute to the greenhouse effect, however. To reduce the use of greenhouse gases, $NF_3$ been used as the cleaning gas in a remotely generated plasma. An argon gas carrier stabilizers the plasma discharge in a plasma chamber separate from the CVD reactor. This process is disclosed in U.S. Pat. No. 6,187,691 and U.S. application Ser. No. 2002/0011210A1.

Similarly, after the depositing a low-k film, a CVD reactor is typically contaminated with carbon, silicon, oxygen, and hydrogen containing residues. Fluorine-containing species derived from $NF_3$ are introduced from a separate plasma chamber through a conduit into the CVD reactor, thus removing these contaminants. Although the activated species (e.g., fluorine radicals) react with the contaminants, carbon-containing contaminants react to form fluorocarbon compounds that remain in the CVD chamber. During low-k dielectric film deposition, these fluorocarbon compounds can volatilize and influence the film formation on the wafer.

This fluorocarbon contamination results in an undesirable process gas mixture, adversely influencing the deposition of the low-k layer by, for example, reducing deposition rates, producing non-uniform film thickness on individual wafers, or producing non-uniform film thickness within a lot of sequentially processed wafers. The film non-uniformity on a single wafer is expressed as a percentage, calculated as the difference between the maximum and minimum film thickness on the wafer, divided by the average film thickness of the wafer, divided by 2, and multiplied by 100. The film non-uniformity within a lot or batch of wafers is expressed as a percentage, calculated as the difference between the maximum and minimum film thickness in the lot, divided by the average film thickness of the lot, divided by 2, and multiplied by 100. Typically, the film non-uniformity of the first wafer is worse compared with the second wafer. For example, in one 25-wafer processing cycle, the deposition rate for the first wafer varied ±1.4% compared to the rate for subsequent wafers, and a single wafer film non-uniformity for the first wafer was ±(2.7%–3.5%).

These non-uniformities are undesirable because they affect the device k-value. Device k is the measured capacitance of an isolated dielectric between two parallel metal lines. The capacitance between two parallel conductors is the total cross sectional area between the conductors multiplied by the dielectric constant of the insulating film divided by the distance between the two conductors. For example, the capacitance between a pair of metal lines isolated by a single dielectric film is $C=k_{eff}\epsilon(A/d)$, where $\epsilon=8.85\times10^{-12}$ $C^2/Nm^2$, C is the measured capacitance, A is the total cross sectional area between the two lines (dielectric film thickness t times effective line length $L_{eff}$), d is the distance between the metal circuit lines (the isolation width), and $k_{eff}$ is the effective dielectric constant of the film. Hence, effective k can be calculated as $k_{eff}=(C/\epsilon)$ (d/A). Because capacitance C is dependent on the dielectric film thickness t, $k_{eff}$ is also dependent on film thickness.

In both the fluorocarbon and $NF_3$ plasma cleaning processes, the CVD reactor is cleaned by active fluorine species in an inert gas, for example argon. Both methods produce non-volatile fluorocarbon by-products, however, that may cause undesirable variations in the deposition process.

SUMMARY OF THE INVENTION

The present invention relates to a method of cleaning contaminants from the reaction chamber of a CVD reactor with active oxygen species produced, for example, from an oxygen plasma. The method is particularly suited to cleaning a PECVD (plasma-enhanced CVD) reactor, especially a PECVD reactor used to deposit dielectric films, including low-k films. The method disclosed herein is more particularly suited to cleaning a PECVD reactor used to deposit carbon-containing films, including carbon-doped silicon oxide, which contain Si, C, O, and I—I; silicon carbide films, which contain Si, C, and H; and SiCN films, which contain Si, C, N, and H. A PECVD reactor is typically a single or small batch substrate-processing apparatus used to deposit a film onto a wafer.

The oxygen plasma cleaning process is preferably performed one hour or less before the first wafer of a lot is loaded into the CVD reactor. Twenty-five wafers are a typical lot. This application describes three embodiments that provide active oxygen species to the CVD reaction chamber for cleaning purposes:

(1) An in-situ oxygen plasma cleaning process, wherein an oxygen plasma is generated within the CVD reaction chamber;

(2) A downstream oxygen plasma cleaning process, wherein an oxygen plasma is generated in a plasma chamber separate from the CVD reaction chamber; and (3) A downstream oxygen-fluorine plasma cleaning process, wherein a plasma that contains both active oxygen and fluorine species is generated in a plasma chamber separate from the CVD reaction chamber.

The time required for the cleaning cycle of the CVD reactor using the process disclosed herein depends on the conditions used in the deposition process. Typically, the material deposited, the longer the cleaning cycle. The length of the cleaning cycle may be readily ascertained by one skilled in the art without undue experimentation. After performing an oxygen plasma CVD cleaning step and before loading the first wafer, the reactor may be allowed to idle, for example under maximum vacuum or in stand-by mode, as detail below until the temperature of the wafer support structure has stabilized.

As discussed above, the thickness non-uniformity of the first wafer deposited by a CVD reactor is typically worse compared with the second wafer. For example, in one 25-wafer processing cycle, the deposition rate for the first wafer varied ±1.4% compared to rate for subsequent wafers, and the thickness non-uniformity was ±(2.7%–3.5%). After applying the oxygen plasma cleaning process disclosed herein, however, the deposition rate of the first wafer was less than 1% slower and the thickness non-uniformity was below ±2.5%.

DETAILED DESCRIPTION OF THE PREFERRED EMBODIMENT

Figure 1A:
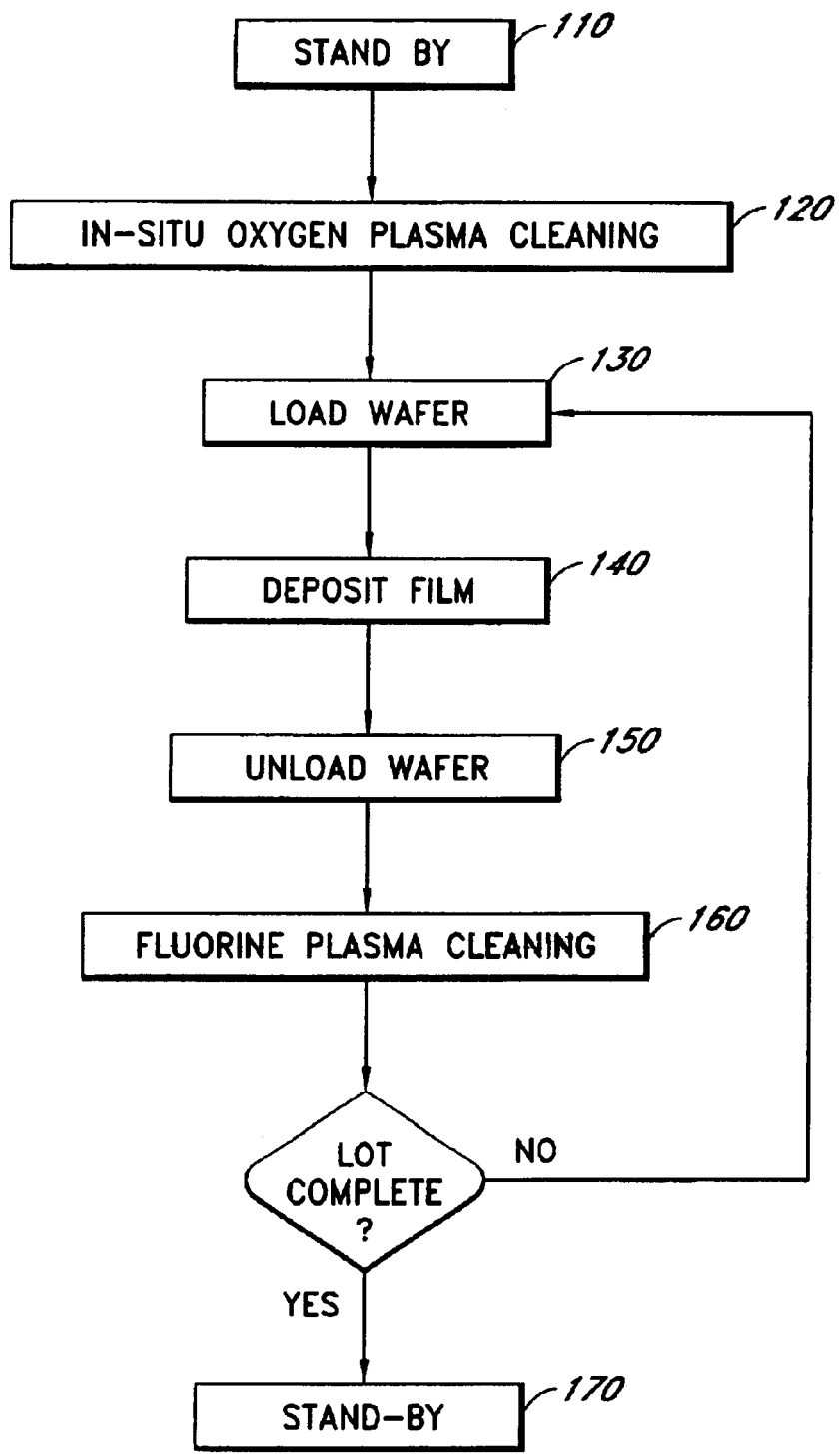
FIG. 1A illustrates a process for depositing a dielectric film on a semiconductor wafer in which the reaction chamber is pre-cleaned with an in-situ oxygen plasma cleaning process, in accordance with a preferred embodiment of the present invention.

As used herein, an oxygen plasma is a plasma comprising active oxygen species effective for cleaning a CVD chamber. A fluorine plasma comprises active fluorine species effective for cleaning a CVD chamber. A plasma that comprises both active oxygen species and active fluorine species is both an oxygen and a fluorine plasma. The active species, including ions and radicals, remove contaminants from the CVD reaction chamber through active species-assisted etching, including ion-assisted etching.

Oxygen-containing gases are those gases that produce active oxygen species when used to generate a plasma. Preferred oxygen-containing gases are $O_2$, $CO_2$, $NO_2$, $N_2O$, $H_2O$, $H_2O_2$, $O_3$, and mixtures of $O_2$ and $O_3$. Fluorine-containing gases are those gases that produce active fluorine species when used to generate a plasma. Fluorine containing gases include fluorine, fluorocarbon gases, hydrofluorocarbon gases, and gaseous nitrogen fluorides. Preferred fluorocarbon gases are $CF_4$, $C_2F_6$, and $C_3F_8$. A preferred hydrofluorocarbon gas is $CHF_3$. A preferred gaseous nitrogen fluoride is $NF_3$. Inert gases are He, Ar, Ne, Kr, and Xe.

Oxygen Plasma Generation

In an in-situ oxygen plasma cleaning process, an oxygen plasma is generated by an RF source through electrodes in a CVD chamber charged with an oxygen-containing gas, optionally mixed with an inert gas or nitrogen. Adding helium or argon enhances the stability of the plasma.

In order to generate a plasma discharge, a 27.12 MHz RF source is output through electrodes in the CVD chamber. Other frequencies may be used to generate the plasma discharge, for example 13.56 MHz, 430 kHz, 400 kHz, 380 kHz, 350 kHz, 300 kHz, and 2 MHz. Dual frequency RF sources are also useful for generating the plasma discharge, for example, 27.12 MHz+400 kHz and 13.56 MHz+430 kHz, where the two frequencies are mixed in a matching network. Selecting the RF frequency and power necessary to generate a satisfactory plasma is within the knowledge of the skilled artisan.

Typical conditions for the in-situ oxygen plasma cleaning process are:

| | |
|---|---|
| $O_2$ | 0.1–5.0 slm |
| He | 0.1–10.0 slm |
| Reactor Pressure | 10–1000 Pa |
| Processing Time | >20 sec |
| RF power | 200–10,000 W |

Preferred conditions are:

| | |
|---|---|
| $O_2$ | 0.5–3.0 slm |
| He | 0.5–5.0 slm |
| Reactor Pressure | 50–500 Pa |
| Processing Time | >60 sec |
| RF power | 500–2000 W |

Particularly preferred conditions are:

| | |
|---|---|
| $O_2$ | 1.0–2.0 slm |
| He | 1.0–2.0 slm |
| Reactor Pressure | 100–250 Pa |
| Processing Time | >120 sec |
| RF power | 500–1000 W |

In a downstream oxygen plasma cleaning process, an oxygen-containing gas is supplied to a plasma chamber separate from the CVD reactor where an oxygen plasma is generated. Remotely generating a plasma for CVD cleaning is described in U.S. Pat. No. 6,187,691 and U.S. application Ser. No. 2002/0011210A1, the disclosures of which are incorporated herein by reference. Briefly, energy, such as microwave or RF energy, is used to dissociate the oxygen-containing gas into active oxygen species. The active oxygen species are then introduced into the CVD reactor located downstream from the plasma chamber. The frequency of RF source ranges from about 400 kHz to about 2.45 GHz. The remote plasma chamber preferably employs a low-field toroidal plasma with a frequency of about 400 kHz. An inert gas or nitrogen may be added to the oxygen-containing gas. Adding helium or argon enhances the stability of the plasma.

Typical conditions for downstream oxygen plasma cleaning process are:

| | |
|---|---|
| $O_2$ | 0.1–5 slm |
| Ar | 0.1–10 slm |
| Reactor Pressure | 10–1350 Pa |
| Processing Time | >20 sec |
| RF power | 200–10,000 W |

Preferred conditions are:

| | |
|---|---|
| $O_2$ | 0.5–3.0 slm |
| Ar | 0.5–5.0 slm |
| Reactor Pressure | 50–500 Pa |
| Processing Time | >60 sec |
| RF power | 1000–5000 W |

Particularly preferred conditions are:

| | |
|---|---|
| $O_2$ | 1.0–2.0 slm |
| Ar | 1.0–2.0 slm |
| Reactor Pressure | 100–250 Pa |
| Processing Time | >120 sec |
| RF power | 1000–3000 W |

In a downstream oxygen-fluorine plasma cleaning process, an oxygen-containing gas and a fluorine containing gas are supplied to a plasma chamber separate from the CVD reactor. RF energy is used to dissociate the oxygen-containing gas and the fluorine containing gas into active oxygen species and active fluorine species, respectively. The active oxygen and fluorine species are then introduced into the CVD reactor located downstream from the plasma chamber. An inert gas or nitrogen may be added to the gas mixture. Adding helium or argon enhances the stability of the plasma. $O_2$ increases the lifetime of the active fluorine species, probably by reduction of fluorine ion recombination. A gas mixture of $NF_3$, argon, and $O_2$ is preferred in the downstream oxygen-fluorine plasma cleaning process.

Typical conditions for the downstream oxygen-fluorine plasma cleaning process are:

| | |
|---|---|
| $O_2$ | 0.1–3.0 slm |
| $NF_3$ | 0.2–5.0 slm |
| Ar | 0.2–10.0 slm |
| Reactor Pressure | 10–1350 Pa |
| Processing Time | >20 sec |
| RF power | 500–10,000 W |

Preferred conditions are:

| | |
|---|---|
| $O_2$ | 0.2–1.0 slm |
| $NF_3$ | 0.5–3.0 slm |
| Ar | 0.5–5.0 slm |
| Reactor Pressure | 50–500 Pa |
| Processing Time | >60 sec |
| RF power | 750–5000 W |

Particularly preferred conditions are:

| | |
|---|---|
| $O_2$ | 0.3–0.5 slm |
| $NF_3$ | 0.75–1.5 slm |
| Ar | 1.0–4.0 slm |
| Reactor Pressure | 100–250 Pa |
| Processing Time | >120 sec |
| RF power | 2000–3000 W |

In the downstream oxygen and oxygen-fluorine plasma cleaning processes, an initial plasma may be generated in the plasma chamber prior to the introduction of the cleaning gas, either an oxygen-containing gas, or a mixture of an oxygen-containing gas and a fluorine-containing gas. In one preferred embodiment, the initial plasma is generated from an inert gas. In a second preferred embodiment, the initial plasma is generated from $O_2$ gas.

Oxygen Plasma Cleaning of CVD Reactors

The oxygen plasma CVD cleaning process disclosed herein is useful in both low-k film and SiC deposition processes. As used hereinafter, in "stand-by mode" the CVD chamber pressure is set to about 533.2 Pa and about 1 slpm $N_2$ flow.

FIG. 1A illustrates one preferred embodiment of the dry plasma cleaning process. In step 110, the CVD reactor is in standby mode. In step 120, the CVD reactor is pre-cleaned by the in-situ oxygen plasma cleaning process. The first wafer is loaded into the CVD reactor in step 130, the desired film deposited thereon in step 140, and the wafer unloaded in step 150. In step 160, the CVD reactor is cleaned with a remotely generated $NF_3$-argon plasma. Steps 130–160 are repeated for the remaining wafers in the lot. After processing the last wafer, the CVD reactor is returned to standby mode in step 170.

Figure 1B:
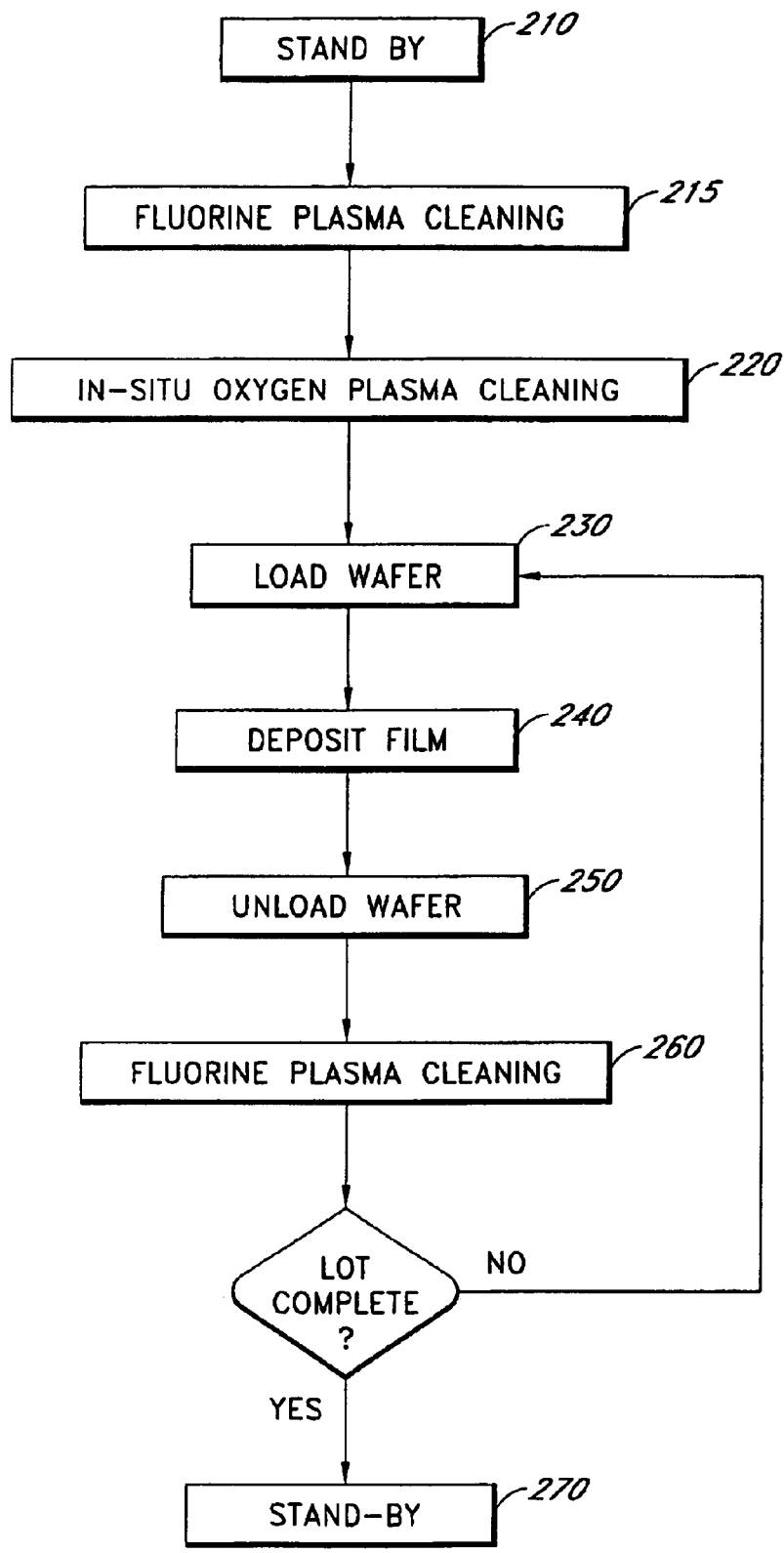
FIG. 1B and FIG. 1C illustrate processes for depositing a dielectric film on a semiconductor wafer in which the reaction chamber is pre-cleaned with an $NF_3$-argon plasma and an in-situ oxygen plasma cleaning process, in accordance with a preferred embodiment of the present invention.
Figure 1C:
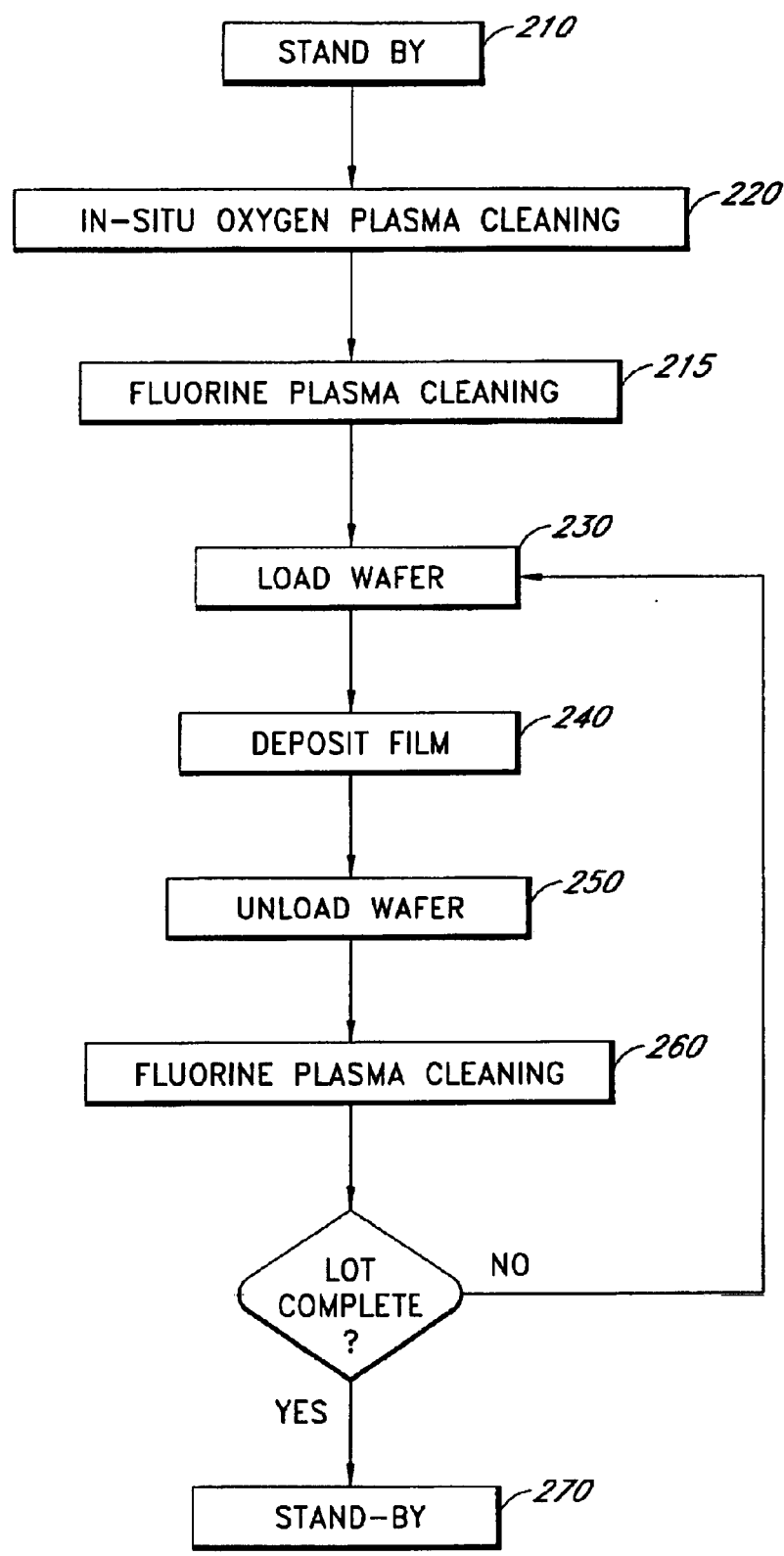

FIG. 1B illustrates a second preferred embodiment of the dry plasma cleaning process. In step 210, the CVD reactor is in stand-by mode. In step 215, the reactor is first cleaned with a remotely generated $NF_3$-argon plasma. In step 220, the reactor is pre-cleaned by the in-situ oxygen plasma cleaning process. Steps 215 and 220 may be performed in either order. For example, in the embodiment illustrated in FIG. 1C, the in-situ oxygen plasma cleaning 220 is performed before the $NF_3$-argon plasma cleaning 215. The first wafer is loaded into the CVD reactor in step 230, the desired film deposited thereon in step 240, and the wafer unloaded in step 250. In step 260, the CVD reactor is cleaned with a remotely generated $NF_3$-argon plasma. Steps 230–260 are repeated for the remaining wafers in the lot. After processing the last wafer, the CVD reactor is returned to standby mode in step 270.

Figure 2A:
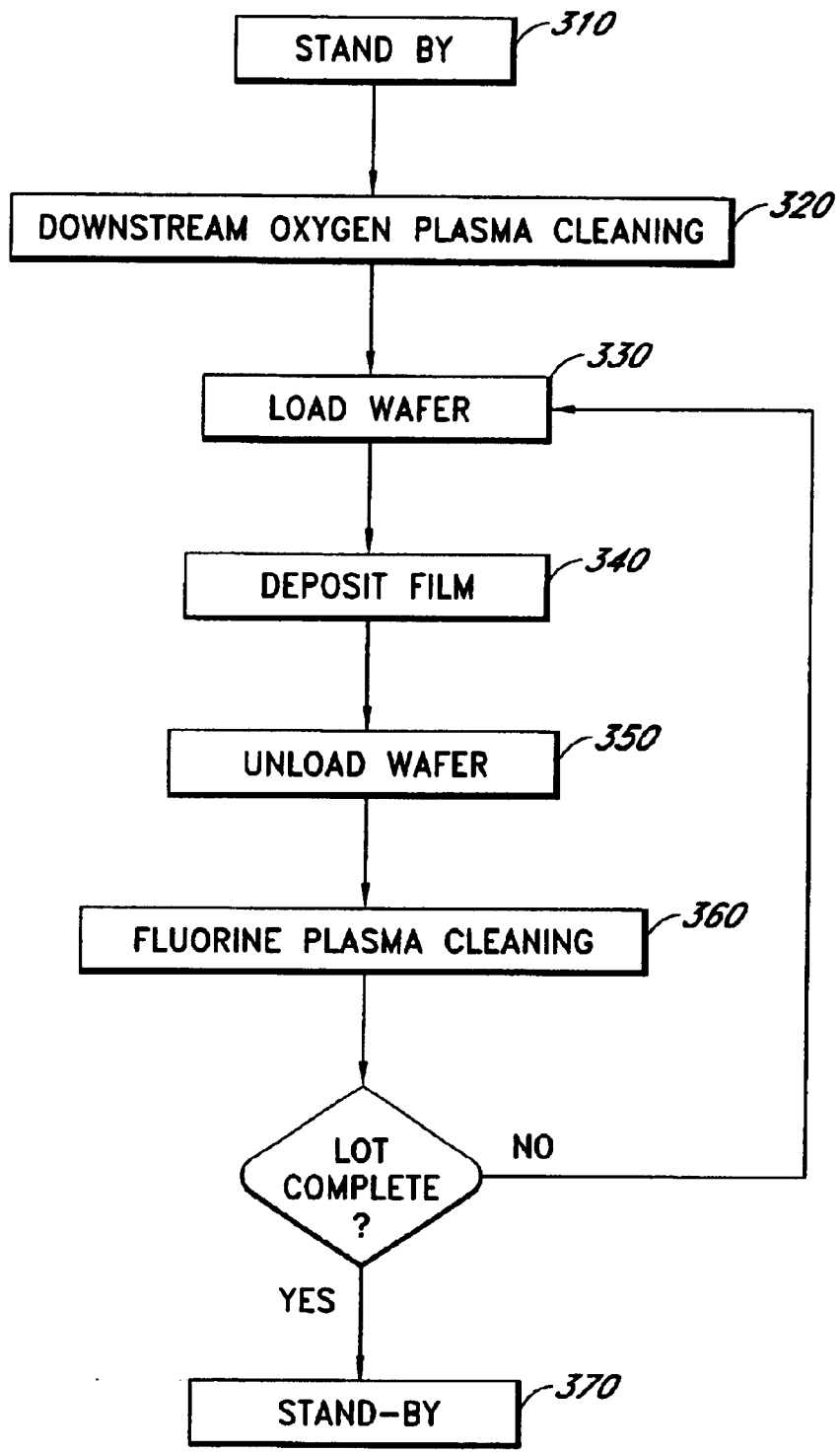
FIG. 2A illustrates a process for depositing a dielectric film on a semiconductor wafer in which the reaction chamber is pre-cleaned with a downstream oxygen plasma cleaning process, in accordance with a preferred embodiment of the present invention.

FIG. 2A illustrates a third preferred embodiment of the dry plasma cleaning process. In step 310, the CVD reactor is in stand-by mode. In step 320, the reactor is pre-cleaned by the downstream oxygen plasma cleaning process. The first wafer is loaded into the CVD reactor in step 330, the desired film deposited thereon in step 340, and the wafer unloaded in step 350. In step 360, the CVD reactor is cleaned with a remotely generated NF$_3$-argon plasma. Steps 330–360 are repeated for the remaining wafers in the lot. After processing the last wafer, the CVD reactor is returned to standby mode in step 370.

Figure 2B:
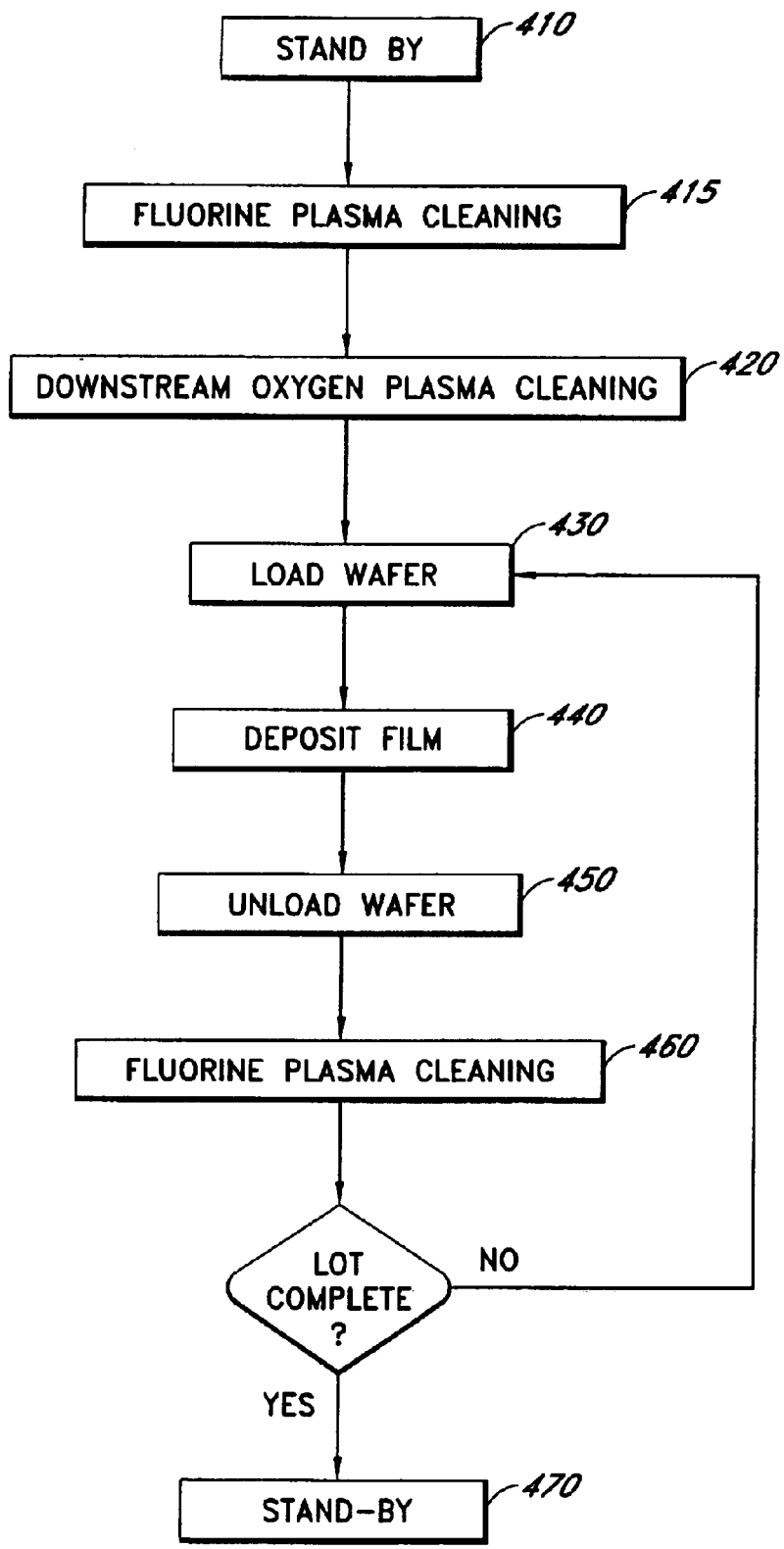
FIG. 2B and FIG. 2C illustrate processes for depositing a dielectric film on a semiconductor wafer in which the reaction chamber is pre-cleaned with an $NF_3$-argon plasma and a downstream oxygen plasma cleaning process, in accordance with a preferred embodiment of the present invention.
Figure 2C:
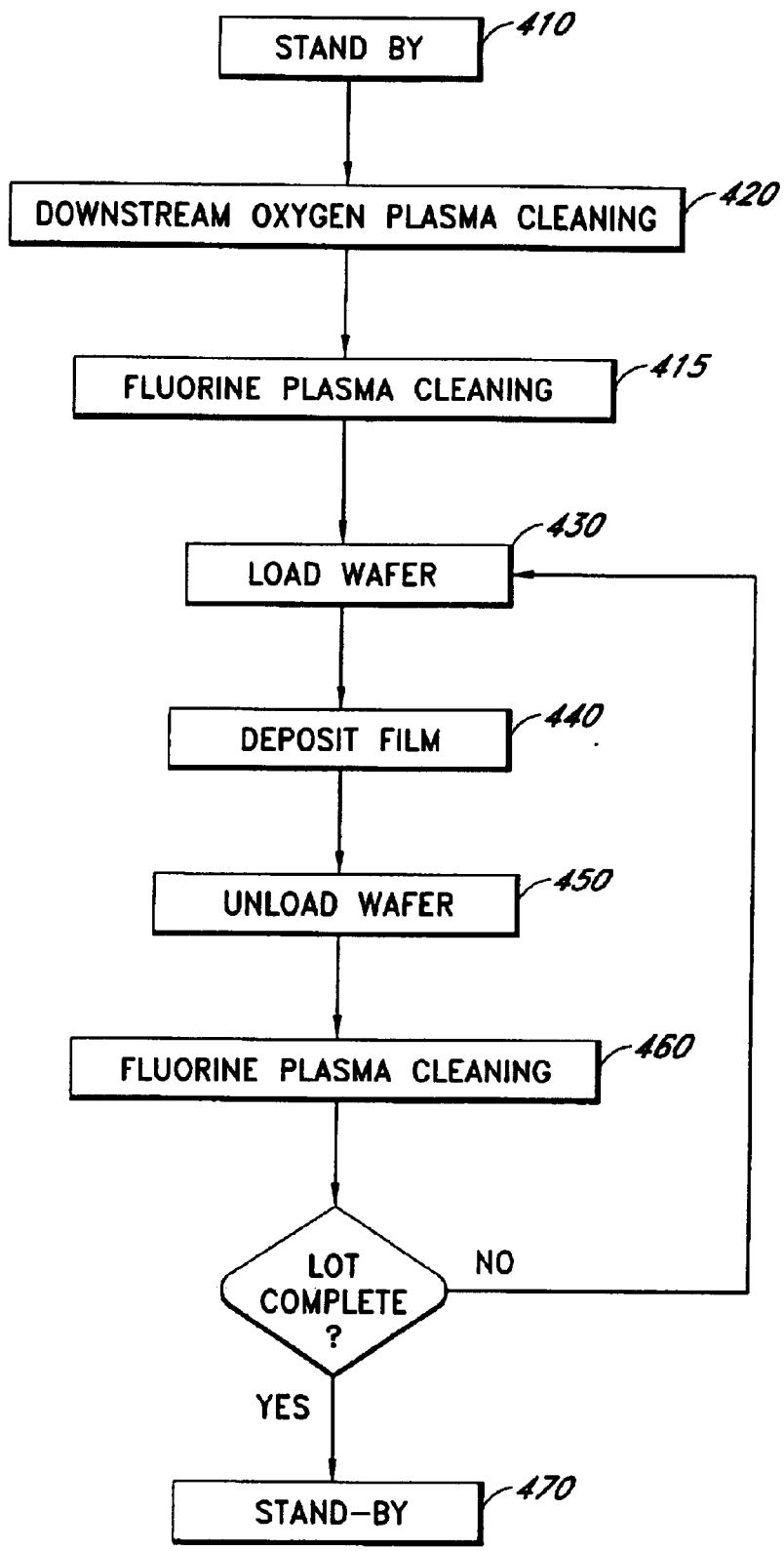

FIG. 2B illustrates a fourth preferred embodiment of the dry plasma cleaning process. In step 410, the CVD reactor is in stand-by mode. In step 415, the CVD reactor is first cleaned with a remotely generated NF$_3$-argon plasma. In step 420, the reactor is pre-cleaned by the downstream O$_2$ plasma cleaning process. Steps 415 and 420 may be performed in either order. For example, in the embodiment illustrated in FIG. 2C, the downstream 0, plasma cleaning 420 is performed before the NF$_3$-argon plasma cleaning 415. The first wafer is then loaded into the CYD reactor in step 430, the desired film deposited in step 440, and the wafer unloaded in step 450. In step 460, the CVD reactor is cleaned with a remotely generated NF$_3$-argon plasma. Steps 430–460 are repeated for the remaining wafers in the lot. After processing the last wafer, the CVD reactor is returned to standby mode in step 470.

Figure 3:
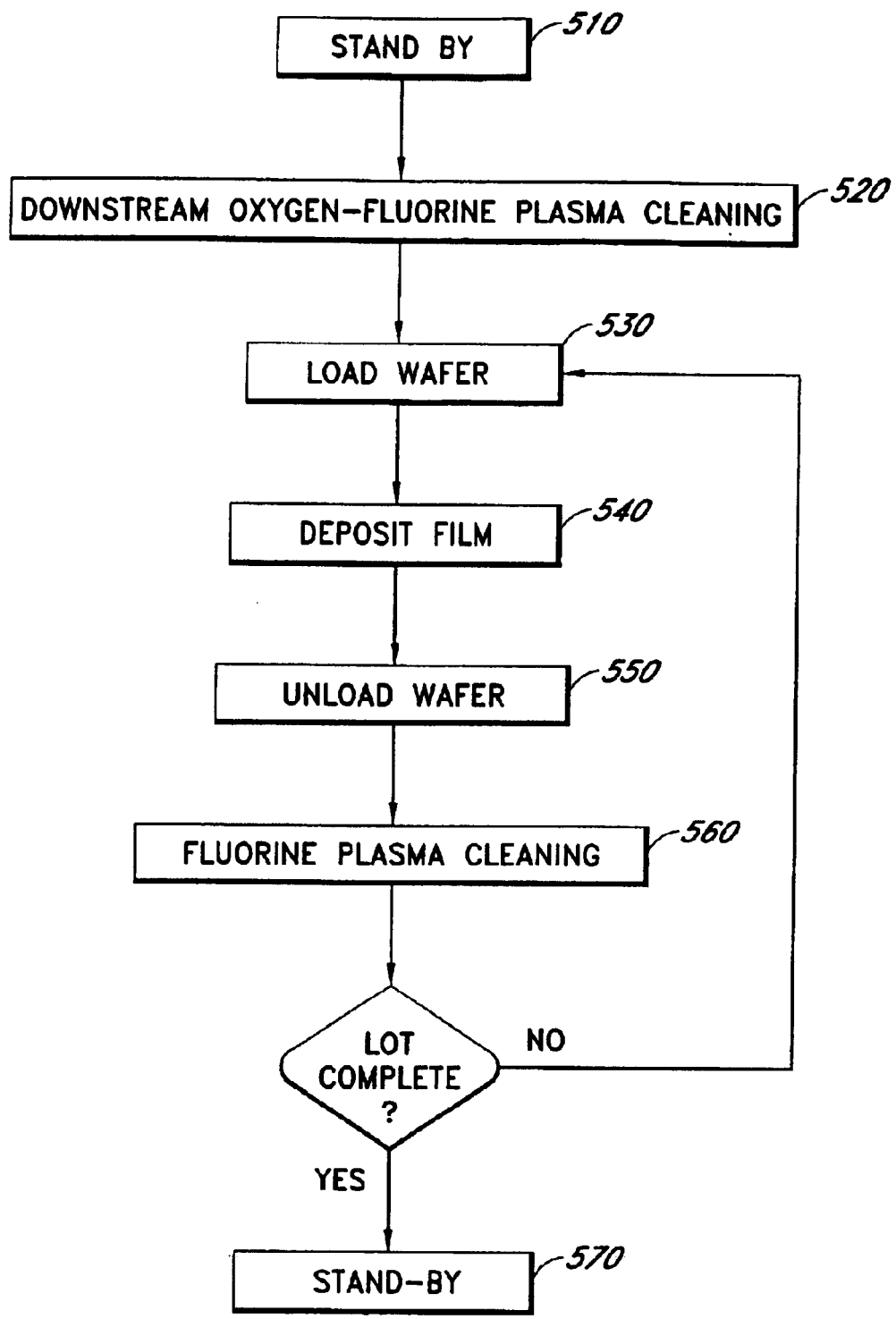
FIG. 3 illustrates a process for depositing a dielectric film on a semiconductor wafer in which the reaction chamber is pre-cleaned with a downstream oxygen-fluorine plasma cleaning process, in accordance with a preferred embodiment of the present invention.

FIG. 3 illustrates a fifth preferred embodiment of the dry plasma cleaning process. In step 510, the reactor is in stand-by mode. In step 520, the reactor is cleaned by the downstream oxygen-fluorine plasma cleaning process. The first wafer is then loaded into the CVD reactor in step 530, the desired film deposited in step 540, and the wafer unloaded in step 550. In step 560, the CVD reactor is cleaned either with a remotely generated NF$_3$-argon plasma or by the downstream oxygen-fluorine plasma cleaning process. Steps 530–560 are repeated for the remaining wafers in the lot. After processing the last wafer, the CVD reactor is returned to standby mode in step 570.

In yet another embodiment of the disclosed dry plasma cleaning process, a fluorine plasma cleaning of the CVD reaction chamber is not performed after the film deposition procedure for each wafer. Instead a fluorine plasma cleaning step is performed after film deposition on a predetermined number of wafers. The required frequency for the fluorine plasma cleaning step depends on the particular deposition conditions and its determination is within the scope of the skilled artisan without undue experimentation. Reducing the frequency of the fluorine plasma cleaning step improves the throughput of the CVD apparatus.

Figure 4:
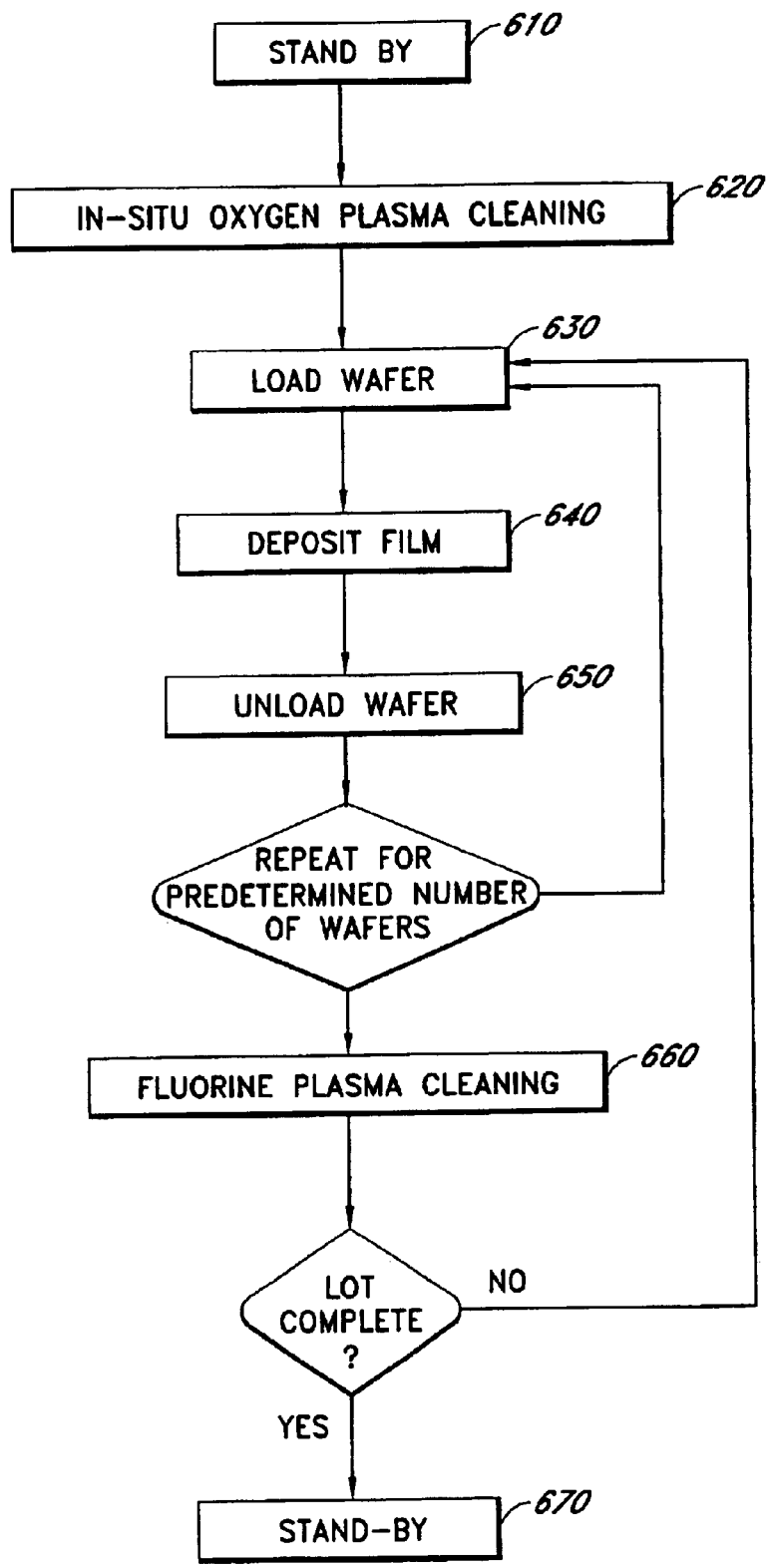
FIG. 4 illustrates a process for depositing a dielectric film on a semiconductor wafer in which the reaction chamber is pre-cleaned with an in-situ oxygen plasma cleaning process, in accordance with a preferred embodiment of the present invention.

Each of the processes illustrated in FIGS. 1–3 may be modified in accordance with this embodiment. For example, a process analogous to that illustrated in FIG. 1A according to the present embodiment is illustrated in FIG. 4. In step 610, the CVD reactor is in standby mode. In step 620, the CVD reactor is pre-cleaned by the in-situ oxygen plasma cleaning process. The first wafer is loaded into the CVD reactor in step 630, the desired film deposited thereon in step 640, and the wafer unloaded in step 650. Steps 630–650 are repeated for a predetermined number of wafers. In step 660, the CVD reactor is cleaned with a remotely generated NF$_3$-argon plasma. Steps 630–660 are repeated for the remaining wafers in the lot. After processing the last wafer, the CVD reactor is returned to standby mode in step 670.

Figure 5:
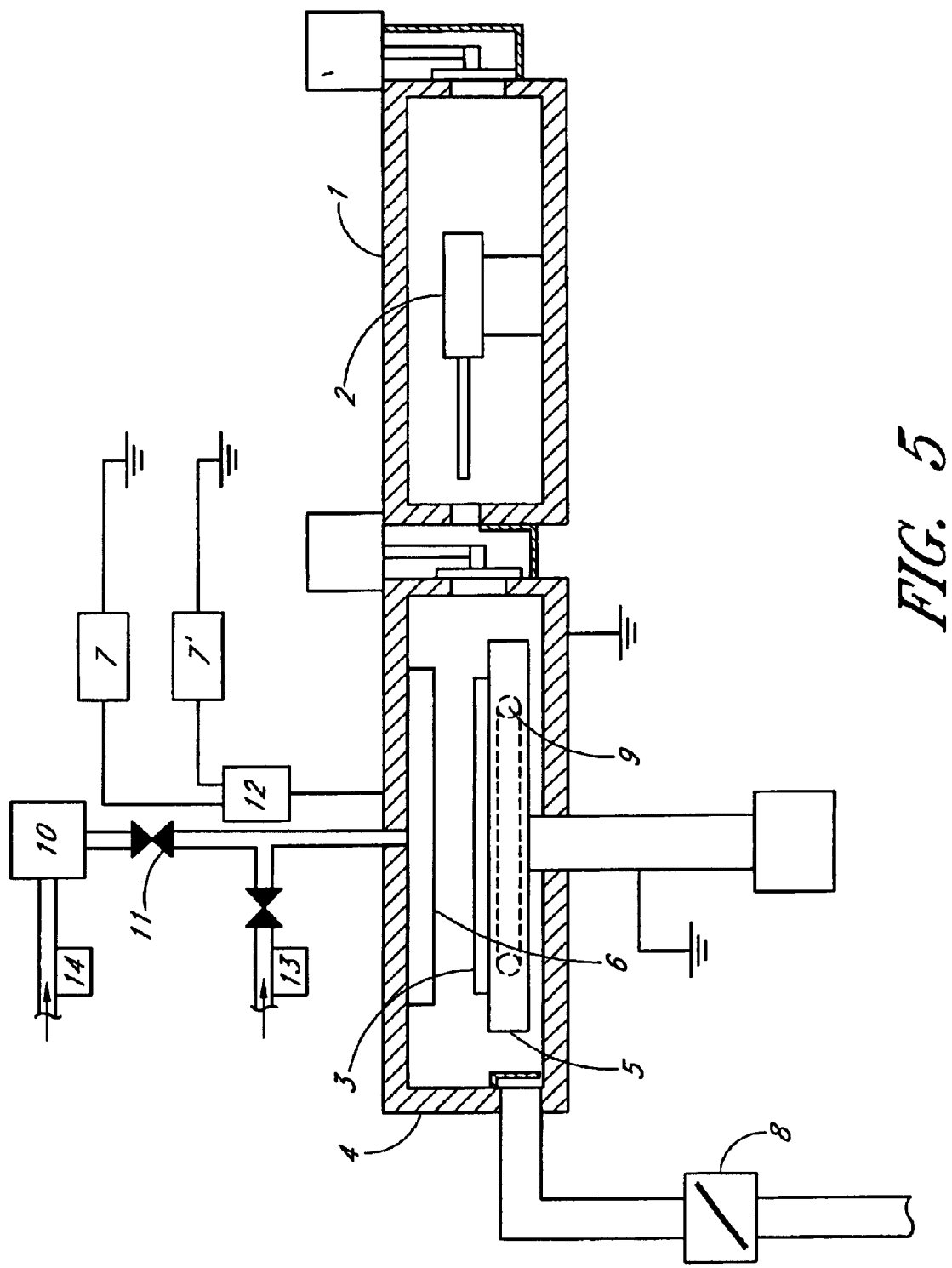
FIG. 5 is a cross section of a PECVD apparatus suitable for practicing the disclosed methods.

FIG. 5 illustrates a parallel-plate type plasma enhanced CVD apparatus in which the oxygen plasma cleaning process disclosed wherein may be performed. The cleaning process may be also be performed in other types of CVD apparatus, for example, a reduced pressure thermal CVD apparatus. The CVD apparatus shown in FIG. 5 is configured for providing a remotely generated plasma to the CVD processing chamber.

A procedure for depositing a film on a semiconductor wafer in the apparatus shown in FIG. 5 is performed as follows. After a stand-by period, one wafer 3 is placed within a transfer chamber 1. The wafer 3 is loaded onto a wafer support structure, or susceptor, 5 within a processing chamber 4 adjacent to a conveying chamber 1 by an auto transfer robot 2. The susceptor 5 also serves as an electrode equipped with a heater (heating element) 9 embedded therein. A reaction gas is evenly supplied onto the wafer 3 from a showerhead 6, which is parallel to the susceptor 5. Radio-frequency power is applied to the showerhead 6 by radio-frequency oscillators 7 and 7'. An RF matching system 12 is used between the radio-frequency oscillators 7 and 7', and the processing chamber 4.

EXAMPLE 1

Low Dielectric Constant Organo Silicon Glass Deposition Process

To deposit a SiCO film onto the silicon wafer 3, a mixed gas of Si(OCH$_3$)$_2$(CH$_3$)$_2$ and helium is supplied as the reaction gas from the showerhead 6 to the processing chamber 4. The pressure within the processing chamber 4 is controlled and adjusted below about 1060 Pa using a conductance regulating valve 8 linked to the processing chamber 4. The heater 9 heats the susceptor 5 on which the wafer 3 is loaded. The wafer 3 is then heated to about 350–400° C. upon being loaded onto the susceptor 5. Radio-frequency power at 13.56 MHz, mixed power at 13.56 MHz and 430 MHz, power at 27.12 MHz, or mixed power at 27.12 MHz and 400 kHz is applied between the susceptor 5 and the showerhead 6. The resulting plasma forms a thin film on the wafer 3. After the thin film is formed, the wafer 3 is conveyed out of the processing chamber 4 by the auto transfer robot 2.

In other embodiments, mixtures of tetramethylsilane, Si(CH$_3$)$_4$, or trimethylsilane, SiH(CH$_3$)$_3$, and an oxygen-containing gas, for example O$_2$, NO$_2$, CO$_2$, H$_2$O, O$_3$ and mixtures thereof, may also be used as the reaction gas to deposit SiCO films.

In order to remove contaminants (SiCO compounds in this case) from the processing chamber 4 after the film deposition step, the oxygen plasma cleaning process disclosed herein is used. Plasma ignition of argon by radio-frequency power in a remote plasma discharge chamber 10 is followed by introducing a gas mixture of O$_2$ and NF$_3$ into remote the plasma discharge chamber 10. After the gases are disassociated and activated, they are brought into the processing chamber 4 through a valve 11, thereby cleaning the processing chamber 4.

The film-deposition and cleaning processes are performed alternately for each lot of wafers.

Exemplary SiCO film deposition conditions are:

| | |
|---|---|
| Si(OCH$_3$)$_2$(CH$_3$)$_2$ | 140 sccm |
| Helium | 50 sccm |
| RF power (27.12 MHz) | 1500–1650 W |
| Pressure | 560 Pa |
| Electrode gap | 24 mm |
| Substrate temperature | 370–380° C. |

Exemplary downstream fluorine plasma cleaning conditions are:

| | |
|---|---|
| NF$_3$ | 1 slm |
| Argon | 5 slm |
| RF power (400 kHz) | 2.1–2.8 kW |

EXAMPLE 2

Silicon Carbide (SiC) Deposition Process

Silicon carbide (SiC) films are used as hardmasks, as etch stop films for dual damascene dry etch processes, or as Cu diffusion barrier films. In depositing SiC, tetramethylsilane, Si(CH$_3$)$_4$, is supplied to the CVD reactor instead of the Si(OCH$_3$)$_2$(CH$_3$)$_2$ used in SiCO film deposition. Referring to FIG. 5, a mixed gas of tetramethylsilane and helium is supplied as the reaction gas from the showerhead 6 to the processing chamber 4. The pressure in the processing chamber 4 is adjusted below about 1060 Pa using the conductance regulating valve 8. The heater 9 heats the susceptor 5 on which a wafer 3 is loaded. The wafer 3 is heated to about 300–380° C. upon being loaded onto the susceptor 5. Radio-frequency power at 13.56 MHz, mixed power at 13.56 MHz and 430 MHz, power at 27.12 MHz, or mixed power at 27.12 MHz and 400 kHz is applied between the susceptor 5 and the showerhead 6. The resulting plasma deposits a thin film of SiC onto the wafer 3. After the thin film is formed, the wafer 3 is conveyed out of the processing chamber 4 by the auto transfer robot 2. In other embodiments, trimethylsilane (SiH(CH$_3$)$_3$) may also be used to deposit SiC films. An oxygen poor SiCO film may also be used in place of a SiC film, and may be deposited by adding an oxygen-containing gas such as O$_2$, NO$_2$, CO$_2$, O$_3$, or mixtures thereof to the reaction gas mixture. CO$_2$ is a preferred oxygen-containing gas for depositing such SiCO films.

Exemplary SiC film deposition conditions are:

| | |
|---|---|
| Tetramethylsilane | 200–700 sccm |
| Helium | 500–5000 sccm |
| RF power (27.12 MHz) | 300–1000 W |
| RF power (400 kHz) | 100–300 W |
| Pressure | 300–700 Pa |
| Electrode gap | 24 mm |
| Substrate temperature | 320–380° C. |

Exemplary downstream oxygen-fluorine plasma cleaning conditions are:

| | |
|---|---|
| NF$_3$ | 0.5–1 slm |
| Argon | 2–5 slm |
| O$_2$ | 0.1–1.0 slm |
| RF power (400 kHz) | 2.0–2.8 kW |

SiCN films may be used in place of silicon carbide films. An SiCN film may be deposited by adding a nitrogen-containing gas, for example NH3, to the deposition gas mixture.

EXAMPLE 3

Pre-process Cleaning

The following three plasma dry cleaning sequences are used for both low-k film and SiC pre-process cleaning.

Referring to FIG. 5, in the in-situ oxygen plasma cleaning method, O$_2$ and He enter the CVD reactor through a gas line 13. The pressure in the reactor is controlled by the conductance control valve 8. When the pressure in the reactor reaches a set point, RF power is turned on. RF power at 27 MHz dissociates the O$_2$ gas into reactive species. Reactive oxygen species with sufficient ion-bombardment energy will react with fluorine and carbon compounds deposited on the walls of reaction chamber 4 and the susceptor 5. The process converts non-volatile compounds into volatile compounds, which are then pumped out through the gate valve 8. After a pre-set "plasma on" time, the RF power, and the O$_2$ and He gases are automatically turned off. The conductance control valve 8 is opened fully to allow complete pump down of the entire reactor to remove the by-products.

In the downstream oxygen plasma cleaning process, an inert gas such as argon is introduced into the remote plasma chamber 10 via the gas-line 14. The valve 11 is opened at the same time. When the gas pressure reaches a set point in the plasma chamber 10, power to the remote plasma unit 10 is turned on. A pre-mixed gas mixture of an oxygen-containing gas and an inert gas, for example O$_2$ and argon, is introduced into the plasma chamber 10 through the gas line 14. The O$_2$ dissociates in the plasma chamber 10. The reactive cleaning species enter the CVD chamber through the valve 11. Reactive cleaning species with sufficient energy will remove fluorine and carbon compounds deposited on the walls of the reactor chamber 4 and the susceptor 5 by active species (e.g., radical) assisted etching. This process converts these non-volatile compounds into volatile by-products, which are pumped out through the gate valve 8. After a pre-set "plasma on" time, the remote plasma unit 10 automatically turns off, followed by the flow of both the pre-mixed gas and the argon. The conductance control valve 8 is opened fully to allow the complete pump-down of the entire reactor to remove the by-products.

In the downstream oxygen-fluorine plasma cleaning process, a pre-mixed oxygen-containing gas, for example O$_2$ mixed with argon, is introduced into the remote plasma chamber 10 through the gas-line 14. The valve 11 is opened at the same time. When the gas pressure reaches a set point in the plasma chamber 10, power to the remote plasma unit 10 is turned on. Next, a fluorine-containing gas, for example NF$_3$, is introduced into the plasma chamber 10 through the gas line 14. The gases dissociate in the plasma chamber 10. The reactive cleaning species enter the CVD plasma processing chamber 4 though the valve 11. The O$_2$ increases fluorine reactive species concentration by reducing fluorine ion recombination. The resulting plasma includes both reactive oxygen species and reactive fluorine species. Reactive cleaning species with sufficient energy will remove fluorine and carbon compounds deposited on the walls of the processing chamber 4 and the susceptor 5 by active species (e.g., radical) assisted etching. This process converts these non-volatile compounds into volatile by-products, which are pumped out through the gate valve 8. After a pre-set "plasma on" time, the remote plasma unit 10 automatically turns off, followed by the flow of the gas sources. The conductance control valve 8 is opened fully to allow the complete pump-down of the entire reactor to remove the by-products.

The embodiments illustrated and described above are provided as examples of certain preferred embodiments of the present invention. Various changes and modifications can be made to the embodiments presented herein by those skilled in the art without departure from the spirit and scope of this invention, the scope of which is limited only the claims appended hereto.

What is claimed is:

1. A processing cycle for forming a carbon-containing film on a semiconductor substrate in a CVD reaction chamber comprising
    (i) contacting the CVD reaction chamber with an active oxygen species;
    (ii) transferring a semiconductor substrate into the CVD reaction chamber;
    (iii) depositing a carbon-containing film on the semiconductor substrate;
    (iv) transferring the semiconductor substrate out of the CVD reaction chamber; and
    (v) contacting the CVD reaction chamber with an active fluorine species,
    wherein steps (ii), (iii), and (iv) are performed after step (i) and before step (v).

2. The processing cycle of claim 1 further comprising repeating steps (ii), (iii), (iv), and (v) a predetermined number of times with additional semiconductor substrates.

3. The processing cycle of claim 1 wherein steps (ii) through (iv) are repeated a predetermined number of times with additional semiconductor substrates before step (v) is performed.

4. The processing cycle of claim 1 wherein the active oxygen species is a product of an oxygen plasma generated within the CVD reaction chamber.

5. The processing cycle of claim 1 wherein the active oxygen species is a product of an oxygen plasma generated outside the CVD reaction chamber.

6. The processing cycle of claim 1 further comprising a separate step of a first contacting of the CVD reaction chamber with an active fluorine species before step (ii).

7. The processing cycle of claim 6 wherein the first contacting of the CVD reaction chamber with an active fluorine species occurs after contacting the CVD reaction chamber with an active oxygen species.

8. The processing cycle of claim 6 wherein the first contacting of the CVD reaction chamber with an active fluorine species occurs before contacting the CVD reaction chamber with an active oxygen species.

9. The processing cycle of claim 6 wherein the active fluorine species is a product of a fluorine plasma generated from a gas comprising a fluorine-containing gas selected from the group consisting of fluorine, fluorocarbon gases, hydrofluorocarbon gases, and gaseous nitrogen fluorides.

10. The processing cycle of claim 9 wherein the fluorine-containing gas is selected from the group consisting of $CF_4$, $C_2F_6$, $C_3F_8$, and $CHF_3$.

11. The processing cycle of claim 9 wherein the fluorine-containing gas is $NF_3$.

12. The processing cycle of claim 9 wherein the fluorine plasma is generated outside the CVD reaction chamber.

13. The processing cycle of claim 9 wherein the gas further comprises an inert gas selected from the group consisting of He, Ar, Ne, Kr, and Xe.

14. The processing cycle of claim 1 wherein the carbon-containing film comprises Si, C, O, and H.

15. The processing cycle of claim 1 wherein the carbon-containing film comprises Si, C, and H.

16. The processing cycle of claim 1 wherein the carbon-containing film comprises Si, C, N, and H.

17. The processing cycle wherein the active oxygen species is the product of an oxygen plasma generated from a gas comprising an oxygen-containing gas selected from the group consisting of $O_2$, $CO_2$, $NO_2$, $N_2O$, $H_2O$, $H_2O_2$, and $O_3$.

18. The processing cycle of claim 17 wherein the gas further comprises $NF_3$.

19. The processing cycle of claim 17 wherein the gas further comprises an inert gas selected from the group consisting of He, Ar, Ne, Kr, and Xe.

20. The processing cycle of claim 17 wherein the gas further comprises $N_2$.

21. A method of cleaning a CVD reaction chamber used for depositing a carbon-containing film onto a semiconductor substrate comprising contacting the CVD reaction chamber with an active fluorine species followed by contacting the CVD reaction chamber with an active oxygen species wherein
    the cleaning is performed before depositing a carbon-containing film, and
    a carbon containing film is not deposited between the contacting the CVD reaction chamber with an active fluorine species, and the contacting the CVD reaction chamber with an active oxygen species.

22. The method of claim 21 wherein the active oxygen species is a product of an oxygen plasma generated within the CVD reaction chamber.

23. The method of claim 21 wherein the active oxygen species is a product of an oxygen plasma generated outside the CVD reaction chamber.

24. The method of claim 21 wherein the active fluorine species is a product of a fluorine plasma generated from a gas comprising a fluorine-containing gas selected from the group consisting of fluorine, fluorocarbon gases, hydrofluorocarbon gases, and gaseous nitrogen fluorides.

25. The method of claim 24 wherein the fluorine-containing gas is selected from the group consisting of $CF_4$, $C_2F_6$, $C_3F_8$, and $CHF_3$.

26. The method of claim 24 wherein the fluorine-containing gas is $NF_3$.

27. The method of claim 24 wherein the gas further comprises an inert gas selected from the group consisting of He, Ar, Ne, Kr, and Xe.

28. The method of claim 24 wherein the fluorine plasma is generated outside the CVD reaction chamber.

29. The method of claim 21 wherein the carbon-containing film comprises Si, C, O, and H.

30. The method of claim 21 wherein the carbon-containing film comprises Si, C, and H.

31. The method of claim 21 wherein the carbon-containing film comprises Si, C, N, and H.

32. The method of claim 21 wherein the active oxygen species is the product of an oxygen plasma generated from a gas comprising an oxygen-containing gas selected from the group consisting of $O_2$, $CO_2$, $NO_2$, $N_2O$, $H_2O$, $H_2O_2$, and $O_3$.

33. The method of claim 32 wherein the gas further comprises $NF_3$.

34. The method of claim 32 wherein the gas further comprises an inert gas selected from the group consisting of He, Ar, Ne, K, and Xe.

35. The method of claim 32 wherein the gas further comprises $N_2$.

36. A processing cycle for forming a carbon-containing film on a semiconductor substrate in a CVD reaction chamber comprising:
    a first cleaning comprising contacting the CVD reaction chamber with an active oxygen species;
    a deposition comprising depositing a carbon-containing film on the semiconductor substrate; and
    a second cleaning comprising contacting the CVD reaction chamber with an active fluorine species,
    wherein the deposition occurs after the first cleaning and before the second cleaning.

37. The processing cycle of claim 36 wherein the first cleaning further comprises contacting the CVD reaction chamber with an active fluorine species.

38. The processing cycle of claim 36 wherein, in the first cleaning, the CVD reaction chamber is contacted with an active fluorine species before with an active oxygen species.

39. The processing cycle of claim 36 wherein the deposition further comprises depositing a carbon-containing film on a predetermined number of additional semiconductor substrates.

40. The processing cycle of claim 36 further comprising repeating the deposition and second cleaning on a predetermined number of additional semiconductor substrates.

* * * * *

UNITED STATES PATENT AND TRADEMARK OFFICE
CERTIFICATE OF CORRECTION

PATENT NO. : 6,767,836 B2  Page 1 of 1
DATED : July 27, 2004
INVENTOR(S) : Nelson Loke Chou San et al.

It is certified that error appears in the above-identified patent and that said Letters Patent is hereby corrected as shown below:

Column 11,
Line 59, after "cycle" insert -- of claim 1 --.

Column 12,
Line 50, delete "K," and insert -- Kr, --.

Signed and Sealed this

Twenty-eighth Day of March, 2006

JON W. DUDAS
*Director of the United States Patent and Trademark Office*